United States Patent [19]

Mira et al.

[11] Patent Number: 4,849,644
[45] Date of Patent: Jul. 18, 1989

[54] OPTOELECTRIC DISTANCE MEASURING APPARATUS WITH DELAY AND ZERO CROSS DETECTOR

[75] Inventors: Silvio Mira, Wermatswil, Switzerland; Rudolf Schwarte, Netphen-Dreistietenbach, Fed. Rep. of Germany

[73] Assignee: Zellweger Uster AG, Uster, Switzerland

[21] Appl. No.: 229,805

[22] Filed: Aug. 5, 1988

Related U.S. Application Data

[63] Continuation of Ser. No. 84,874, Aug. 13, 1987, abandoned.

[30] Foreign Application Priority Data

Aug. 13, 1986 [CH] Switzerland ............... 03240/86

[51] Int. Cl.$^4$ .................................... G01N 21/86
[52] U.S. Cl. ........................... 250/561; 356/5
[58] Field of Search ............ 250/221, 222.1, 239, 250/201, 560, 561; 340/555, 556; 354/403; 356/5

[56] References Cited

U.S. PATENT DOCUMENTS

| | | | |
|---|---|---|---|
| 4,139,301 | 2/1979 | Chaborski | 356/5 |
| 4,181,431 | 1/1980 | Chaborski | 356/5 |
| 4,344,705 | 8/1982 | Kompa et al. | 256/5 |
| 4,521,107 | 6/1985 | Chaborski et al. | 356/5 |
| 4,553,836 | 11/1985 | Meier et al. | 356/5 |
| 4,699,508 | 10/1987 | Bölkow et al. | 356/5 |
| 4,734,587 | 3/1988 | Schwarte | 356/5 |

OTHER PUBLICATIONS

"New Simple Circuits to Eliminate Time Slewing", Review of Scientific Instruments, vol. 45, No. 10, Oct. 1974, pp. 1235–1238.

Primary Examiner—David C. Nelms
Attorney, Agent, or Firm—Burns, Doane, Swecker & Mathis

[57] ABSTRACT

A distance measuring apparatus based on a time-of-flight measurement of a light pulse is provided. The apparatus includes a light pulse transmitter having a diode laser and a light pulse receiver having a photodiode. Connected to the photodiode is a pulse amplifier and a pulse detector. The pulse detector includes a delay line connected to the pulse amplifier and having a short-circuited end, a threshold valve and zero crossing detector connected to the delay line at a predetermined distance from its short-circuited end, and a timer circuit. The delay line conducts an electrical pulse from the pulse amplifier to its short-circuited end where the pulse is reflected and inverted. The threshold value and zero crossing detector determines when a combination of the electrical pulse and its inverted copy crosses a threshold value and a zero value.

6 Claims, 3 Drawing Sheets

FIG. 6
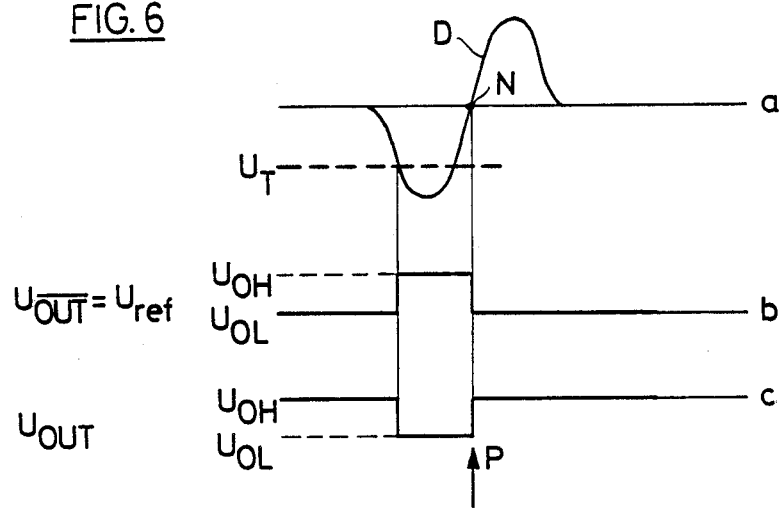
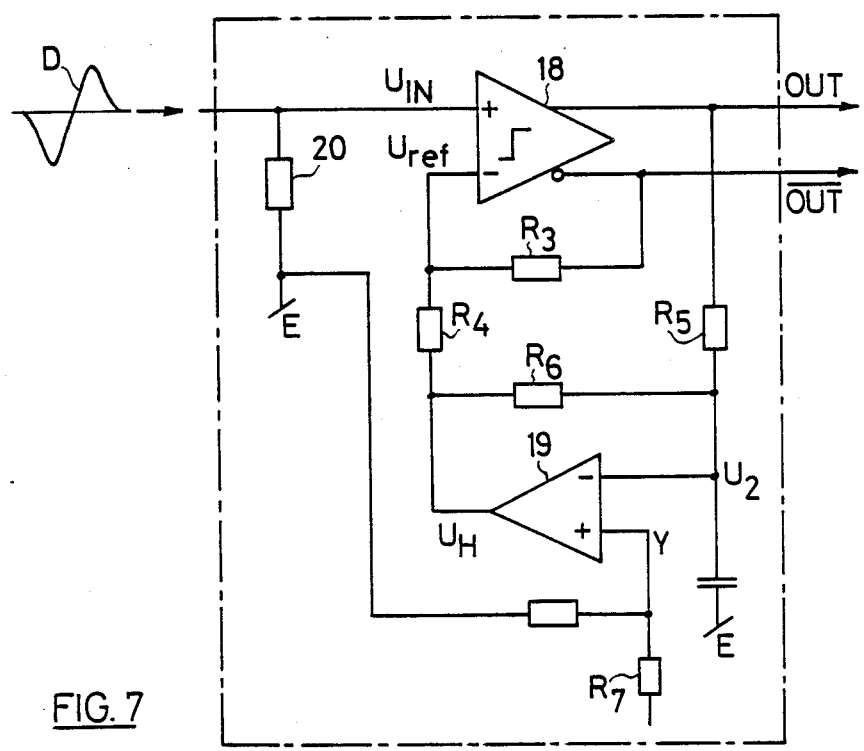
FIG. 7

OPTOELECTRIC DISTANCE MEASURING APPARATUS WITH DELAY AND ZERO CROSS DETECTOR

This application is a continuation of application Ser. No. 084,874, filed Aug. 13, 1987, now abandoned.

BACKGROUND OF THE INVENTION

The invention relates to optoelectric distance measuring apparatus according to the principle of time of flight measurement, with a transmitter containing a laser diode, with a receiver comprising a photo diode for receiving the light impulses reflected from a target, with a pulse amplifier, with a pulse detector for the formation of the difference of the original pulse corresponding to the one reflected light impulse and a delayed copy thereof for the purpose of providing a stop signal for the point in time of reception of a reflected light impulse, and with a time circuit for communicating the time between the start of the emitted light impulse and the stop signal of the pulse detector.

A problem with short impulses is that they cannot be amplified in conformity with their true shape, so that the time-significant signal must be extracted alone from the leading edge, that remains true to the original even after amplification. A suitable method for this is described in the dissertation of A. Glasmacher's "Elektronische Schaltungen fur die Kernstrahlungsmesstechnik im Weltraum dagestellt am Zietmesskanal eines Massenspektrometers", Bochum 1978. According to this method with a so-called "constant fraction trigger", the delayed signal is multiplied by a factor-2, and the zero crossing of the sum of the original signal and the delayed signal is detected. This zero crossing of the sum appears when the leading edge has attained a constant fraction of the pulse amplitude and is thereby independent of the absolute magnitude of the amplitude.

In the circuit used, reflections take place both at the unloaded start and at the short-circuited end of a delay line. An impulse once introduced to the delay line will oscillate therein several times to-and-fro before being completely absorbed by the losses; as a result of this, premature light reflections, which for example originate from the lens or from back scatters in the air, can falsify the detection of the wanted signal.

In laser distance measuring apparatus according to the principle of time of flight measurement published in DE OS No. 26 34 627, a parallel resonance circuit as a working resistance is wired into the diode receiving circuit, the former being triggered across the receiving diode by the reflected light impulse, beginning to oscillate in accordance with its natural resonance. The stop signal is yielded from the intensity-independent zero crossings of the triggered sine signals.

With this distance measuring apparatus too, the detection of the desired impulse can be falsified by premature light reflections not emanating from the target, and also the receiver, compared with that of Glasmachers, is less noise-free and less sensitive.

OBJECTS AND SUMMARY OF THE INVENTION

By means of the invention, distance measuring apparatus will now be given, whose receiver is low in noise and very sensitive, and in which no disturbances due to premature light impulses can appear.

This object is solved according to the invention by a pulse amplifier with a reflection-freely adapted output impedance driving a delay line, at whose short-circuited end an inversion and reflection of the pulse amplifier takes place, and by arranging a threshold value and zero crossing detector at a distance adjusted to the duration of the pulse to be evaluated from the short-circuited end of the delay line.

In the distance measuring apparatus according to the invention, the time-significance signal is not obtained only from the leading edge, but from the leading edge and trailing edge of the pulse. The delay line alone takes on the job of delaying, inversion and addition of the pulse and limits the lower frequency band width - the upper limit is achieved by the pulse amplifier, with advantageous effects on the noise behavior. As the pulse runs to-and-fro through the delay line and subsequently disappears, premature light reflections cannot falsify the detection of the useful pulse. Additionally, the receiver can process any pulse amplitudes in principle, as no non-linear or even limiting circuit elements are involved.

Finally, it should be mentioned that the start signal of the pulse generator inside the apparatus to the laser diode is used as a criterion for the start of the emitted light impulse in known appliances. The distance measuring equipment according to the invention can also be used in this manner, but, because of its unsusceptibility to premature light reflections, a part of the emitted light impulse can be conducted through the receiving channel and used as a start signal, allowing an increased accuracy of measurement.

BRIEF DESCRIPTION OF THE DRAWINGS

In the following, the invention will be more closely explained by means of an example of embodiment and the drawings:

FIG. 6 shows a diagram of a combination of pulses in accordance with the present invention; and FIG. 7 shows another embodiment of a portion of the apparatus of FIG. 1.

DETAILED DESCRIPTION

Figure 1:
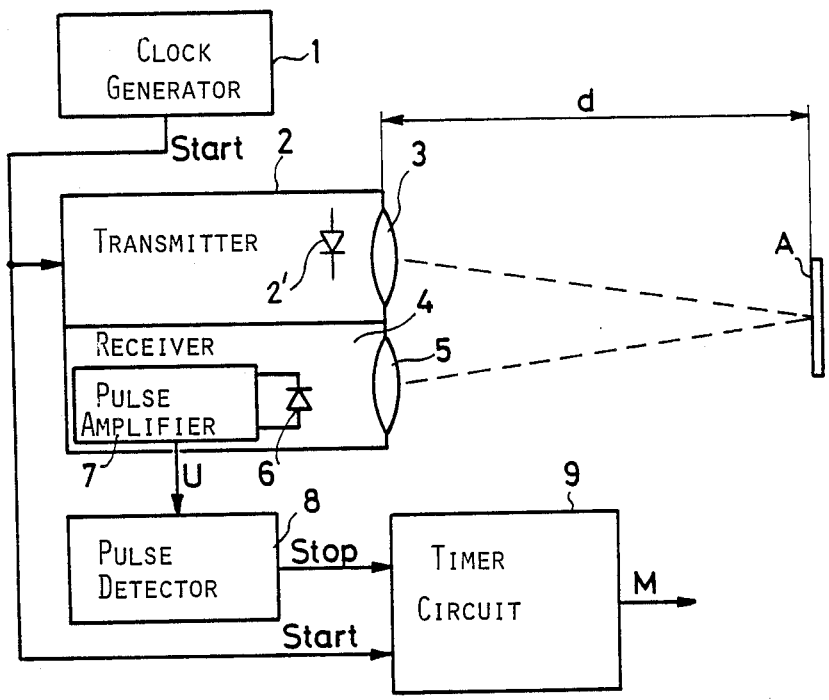
FIG. 1 shows a block diagram of a distance measuring apparatus according to the invention.

The distance measuring apparatus represented in FIG. 1 works according to the principle of pulse time of flight measurement and serves to communicate the distance d of a target A. Essentially, it contains a clock generator 1, a transmitter 2 with a laser diode 2' and a transmitter lens 3, a receiver 4 with a receiver lens 5, a photodiode 6 and a pulse amplifier 7, a pulse detector 8 and a timer circuit 9. The general principles of distance measuring apparatus are known. The reader is referred in this context to the points of the literature referred to in the introduction to the description and to the international application PCT/EP00236 (Publication No. WO 85/05456) together with the prior art referred to therein.

Triggered by a start signal of the clock generator 1, the transmitter 2 produces a short light impulse of duration approximately 15 ns, which arrives across the transmitter lens 3 at the target A, by which it is reflected or back-scattered. A small part of the reflected light impulse is focused by the receiver lens 5 onto the photodiode 6 in which it produces a current impulse, which is transformed by the pulse amplifier 7 into a proportional voltage impulse U. The pulse detector 8 extracts a stop signal from this voltage impulse U, which is led to the timer circuit 9. The timer circuit 9 measures and digitizes the time span between this stop signal and the start signal obtained from the clock generator 1, and delivers a measurement value M for the time of flight $t_L$ from the transmitter 2 to the target A and then back to the receiver 4. Let d be the distance between distance measuring apparatus and target A and c be the speed of light; then the following equation holds for the time of flight $t_L$:

$$t_L = \frac{2d}{c}$$

A significant element of the distance measuring apparatus is formed by the pulse detector 8, which confirms the arrival of an evaluable voltage pulse U and gives out an electrical signal independent of the pulse amplitude, the stop signal already referred to, significant for the point in time of its arrival.

Figure 2:
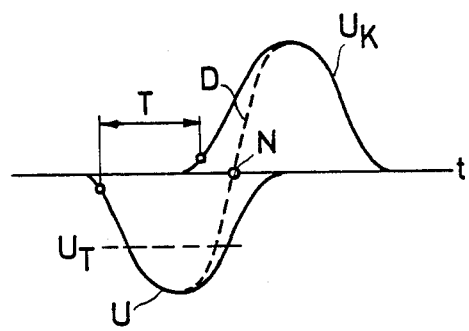
FIG. 2 shows signal pulses used in the operation of the apparatus.

The mode of functioning of the pulse detector 8 may be seen from the diagram represented in FIG. 2. In this, t represents the time axis, U the original pulse (output signal of the pulse amplifier 7), $U_K$ a delayed and inverted copy of the original pulse U, D the difference $U_K$ in relation to U, N the zero crossing of D, T the delay of $U_K$ with respect to U, and $U_T$ a threshold value. If the amount of the difference D exceeds the threshold value $U_T$, then the signal is estimated as evaluable.

The zero crossing N delivers the signal significant for the point in time of arrival of the voltage pulse U, and therewith of the arrival of a reflected light impulse in the receiver 4 (FIG. 1). This is possible because, given unchanged shape of the original pulses in relation to its rise time width, and decay time, the time-significant zero crossing N is independent of the amplitude of the pulse.

Figure 3:
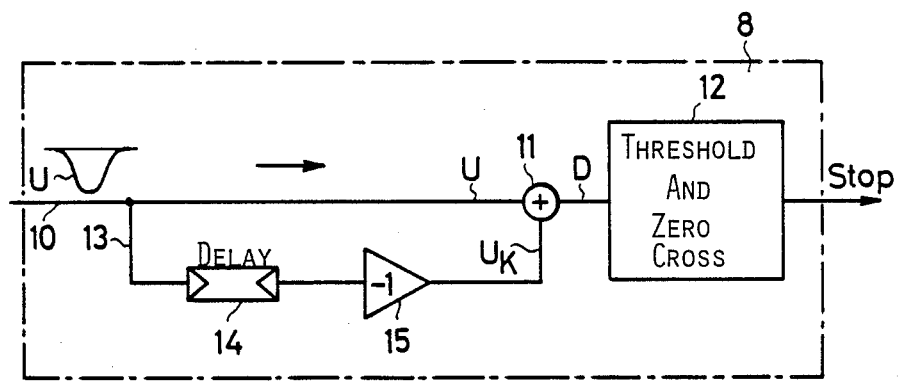
FIG. 3 shows a functional diagram of a pulse detector.

As can be gathered from FIG. 3, the pulse detector 8 contains in its basic construction a line 10 coming from the pulse amplifier 7 (FIG. 1), which is led on the one hand across an addition element 11 to a threshold value and zero crossing detector 12, and from which on the other hand a branch 13 branches off, containing a delaying element 14 and an inversion element 15, and leads to the addition element 11, at whose output the difference D (FIG. 2) is obtainable.

Figure 4:
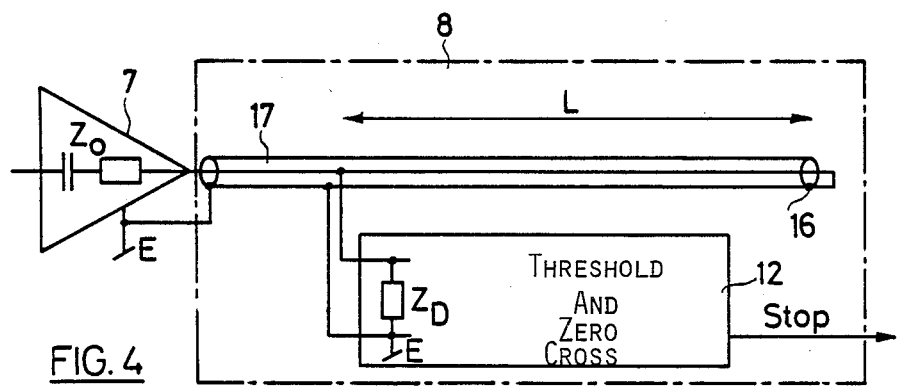
FIGS. 4 and 5 each show diagrams of portions of the apparatus of FIG. 1.

Delay and inversion of a pulse are obtained with special ease by a short-circuited delay line, as is represented in FIG. 4; the pulse amplifier 7 (FIG. 1) with output impedance $Z_O$ drives a delay line 17 comprising a short-circuit 16 at its far end, whose characteristic quantities are the speed of transmission and the wave impedance. The output impedance $Z_O$ of the pulse amplifier 7 is reflection-freely adapted to the wave impedance of the delay line 17. The voltage pulse ambles through the delay line 17 to the short-circuit 16, is there inverted, ambles back and is absorbed by the pulse amplifier 7.

The threshold value and zero crossing detector 12, whose input impedance $Z_D$ is chosen to be so high that it does not influence the processes on the delay line 17, is connected to the delay line 17 at a distance L in front of the short-circuit 16. The threshold value and zero crossing detector 12 "sees" the superposition combination of input and reflected pulses with the delay time T represented in FIG. 2, where;

$$T = 2\frac{L}{v}$$

where v is the speed of transmission along the delay line 17, L is chosen therein so that T corresponds to roughly half of the pulse width, which yields an optimally steep zero crossing of D (FIG. 2). The earth points of the circuit are represented by E.

Several variants are possible for the implementation of the delay line 17, for example it can also be connected - at suitable wave impedance - as a branch, short-circuited at its end, to the connection conductor, between pulse amplifier 7 and threshold value and zero crossing detector 12, or a simulation consisting of several electrical delaying members, instead of a genuine delay line, can be used.

Figure 5:
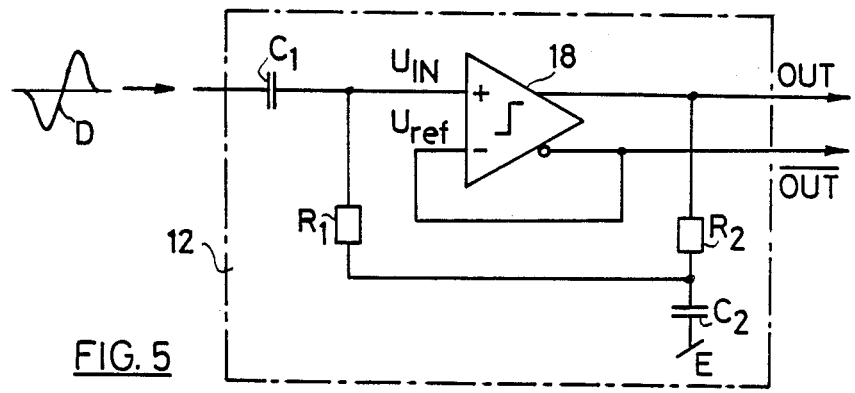

The circuit principle of the threshold value and zero crossing-detector 12 is represented in FIG. 5, which is formed according to the representation by a Schmitt trigger, whose comparator 18 comprises symmetrical push-pull outputs OUT and $\overline{OUT}$. By an RC-Network $R_1$, $C_1$; $R_2$, $C_2$ the direct voltage quiescent level at the comparator input IN is the same as the quiescent level at the output OUT.

The switching processes of the Schmitt-trigger forming the threshold value and zero crossing detector 12 are represented in FIG. 6; line a shows its input signal D, line b shows the signal $U_{\overline{OUT}}$ at the output $\overline{OUT}$ and line c shows a signal $U_{OUT}$ at the output OUT, wherein these two voltages each have either value $U_{OL}$ or $U_{OH}$.

In the quiescent state;

$$U_{\overline{OUT}}(OFF) = U_{OH} = U_{IN}(quiescent)$$

and $$U_{\overline{OUT}}(OFF) = U_{OL} = U_{ref}(OFF)$$

If the input signal D, which "rides" on the quiescent level $U_{IN}$ (quiescent), the threshold voltage ducks below $U_T = U_{ref}(OFF) - U_{IN}(quiescent) = U_{OL} - U_{OH}$ then the comparator 18 switches ON. As both comparator outputs are identically built, at this point $$U_{\overline{OUT}}(ON) = U_{OH} = U_{OUT}(OFF)$$

and thereby $$U_{ref}(ON) = U_{IN}(quiescent)$$

the direct voltage level of $U_{IN}$ does not change.

Just when $U_{IN}$ crosses its quiescent level again, i.e. exactly at the zero crossing N of the signal D, the comparator flips back and thereby delivers the time-significant signal (arrow P).

A slightly simplified circuit of the threshold value and zero crossing detector 12 is represented in FIG. 7. The comparator 18 is a comparator, usual in the trade, with symmetrical push-pull outputs, the reference symbol 19 signifies a direct-voltage amplifier and the resistance 20 represents the wave impedance of the delay line 17 (FIG. 4).

$R_3$, $R_4$, $R_5$, $R_6$ are voltage dividers, wherein the voltage divider $R_5$, $R_6$ imitates the voltage divider $R_3$, $R_4$.

At the output of the direct-voltage amplifier 19 is an auxiliary voltage $U_H$ which adjusts at the quiescent state to a value such that:

$$U_2 = 0 = U_{IN}\text{(quiescent)}$$

$U_H$ remains unchanged in the ON-state, and, thanks to the identical outputs of the comparator 18 and the equal resistors $R_3$, $R_4$; $R_5$, $R_6$, $$U_{ref}(ON) = 0$$

The threshold voltage $U_T$ is:

$$U_T = (U_{OL} - U_{OH}) \frac{R_4}{R_3 + R_4}$$

At point Y in front of the one input of the direct voltage amplifier 19, a small direct voltage can be superimposed on the zero potential across a resistor $R_7$ for offset compensation, also entering at $U_{ref}(ON)$.

In the distance measuring apparatus according to the invention, the time of flight measurement is particularly simple and exact, because the delay line alone takes over the job of delaying, inversion and addition, wherein the arrangement in principle processes any pulse amplitude, as no non-linear or even limiting circuit elements are involved in the time of flight measurements. In addition, the noise behavior is advantageously influenced, because the frequency band width is limited from above by the pulse amplifier and from below by the delay line. Further, the arrangement is insensitive to disturbances within the apparatus, because the zero line of the signal to be processed by the detector is common with the circuit zero point (earth point E in FIGS. 4, 5 and 7).

A unipolar output stage in the pulse amplifier, which can only deliver much current in one direction, in order to bring the unipolar original pulses to the line and absorb the inverted reflections, is sufficient. As one pulse runs to-and-fro through the delay line and finally disappears, premature light reflections, emanating for example from the optical arrangement or from backscattering in the air (fog), cannot falsify the detection of the pulse.

Because of the last-named characteristics a part of the emitted light impulse, instead of the signal of the pulse generator could be conducted into the receiving channel and used as a start signal without further ado, which would enable a high accuracy of measurement.

It is, of course, possible to embody the invention in other specific forms than those of the preferred embodiment described above. This may be done without departing from the essence of the invention. The preferred embodiment is merely illustrative and should not be considered restrictive in any way. The scope of the invention is embodied in the appended claims rather than in the preceding description and all variations and changes which fall within the range of the claims are intended to be embraced therein.

What is claimed is:

1. An optoelectric distance measuring apparatus, comprising:
   means for transmitting at least one light pulse toward a target, the transmitting means including a diode laser and the light pulse having a predetermined duration;
   means for receiving a portion of the at least one light pulse reflected from the target, the receiving means including a photodiode which converts the portion of the at least one light pulse received into an electrical pulse;
   a pulse amplifier connected to the photodiode, the pulse amplifier producing an output corresponding to the electrical pulse and having a predetermined output impedance;
   means for detecting when the portion of the at least one light pulse reflected from the target is received, the detecting means producing a stop signal and including:
      a delay line having a short-circuited end and another end which receives the output pulse;
      a threshold value and zero crossing detector connected to the delay line between the ends of the delay line at a predetermined distance from the short-circuited end in accordance with the predetermined duration; and
      a timer circuit for determining a time difference between a start of the at least one light pulse transmitted and the stop signal,
   wherein the delay line conducts the output pulse from its other end to its short-circuited end, the output pulse being reflected and inverted at the short-circuited end to form a copy pulse, the threshold value and zero crossing detector determining when a combination of the output pulse and the copy pulse crosses a predetermined threshold value and crosses a zero value, and the pulse amplifier's predetermined output impedance is selected so that the pulse amplifier does not reflect the output and copy pulses, and
   wherein the predetermined distance of the threshold value and zero crossing detector from the short-circuited end of the delay line is selected so that a delay between the output pulse and the copy pulse corresponds to substantially half of a width of the output pulse.

2. Distance measuring apparatus according to claim 1, wherein the threshold value and zero crossing detector includes a Schmitt trigger having a comparator with symmetrical push-pull outputs.

3. Distance measuring apparatus according to claim 1, further comprising a clock generator having a signal output connected to the diode laser, wherein the start of the at least one light pulse transmitted is initiated by a start signal of the clock generator.

4. Distance measuring apparatus according to claim 1, wherein one part of the at least one light pulse transmitted is conducted directly to the receiving means and is used as a start signal for establishing the start of the transmitted light pulse.

5. Distance measuring apparatus according to claim 1, wherein the delay line is connected as a branch, short-circuited at one end, to a connection conductor between the pulse amplifier and the threshold value and zero crossing detector.

6. Distance measuring apparatus according to claim 1, wherein the delay line comprises a plurality of electrical delaying elements.

* * * * *